(12) United States Patent
Isakanian et al.

(10) Patent No.: US 8,841,934 B2
(45) Date of Patent: Sep. 23, 2014

(54) HYBRID FREQUENCY COMPENSATION NETWORK

(75) Inventors: Patrick Isakanian, Folsom, CA (US); Kenneth C. Dyer, Davis, CA (US)

(73) Assignee: Vintomie Networks B.V., LLC, Dover, DE (US)

( * ) Notice: Subject to any disclaimer, the term of this patent is extended or adjusted under 35 U.S.C. 154(b) by 221 days.

(21) Appl. No.: 13/406,788

(22) Filed: Feb. 28, 2012

(65) Prior Publication Data

US 2012/0155342 A1    Jun. 21, 2012

Related U.S. Application Data

(60) Division of application No. 12/284,773, filed on Sep. 24, 2008, now Pat. No. 8,134,386, which is a continuation of application No. 12/012,826, filed on Feb. 5, 2008, now abandoned.

(60) Provisional application No. 60/900,180, filed on Feb. 7, 2007.

(51) Int. Cl.
  *H03K 17/16*   (2006.01)
(52) U.S. Cl.
  USPC .......................................... 326/30

(58) Field of Classification Search
  USPC ............................................ 326/30
  See application file for complete search history.

(56) References Cited

U.S. PATENT DOCUMENTS

6,433,626 B1 * 8/2002 Guimaraes ..................... 327/552
2009/0232033 A1   9/2009 Isakanian et al.

OTHER PUBLICATIONS

Moyal, Michael et al., "A 25-KFT, 768-KB/S CMOS Analog Front End for Multiple-Bit-Rate DSL Transceiver", IEEE Journal of Solid-State Circuits, vol. 34, No. 12, Dec. 1999.
Roo, Pierte et al., "A CMOS Transceiver Analog Front End for Gigabit Ethernet Over CAT-5 Cables", ISSCC 2001, Session 19.

* cited by examiner

*Primary Examiner* — Thienvu Tran
(74) *Attorney, Agent, or Firm* — Dorsey & Whitney LLP

(57) ABSTRACT

Hybrid frequency compensation is provided. Hybrid circuits are used to subtract the transmit signal from the receive signal in a full duplex communication system. Since the hybrid circuit and the main line driver are exposed to different loads, accurate subtraction is difficult to achieve. A frequency dependent network is used to match the loading seen by the driver and the hybrid. The compensation network can be based on active and/or passive components.

19 Claims, 2 Drawing Sheets

Conceptual diagram of Driver/Hybrid and Frequency Compensation Network

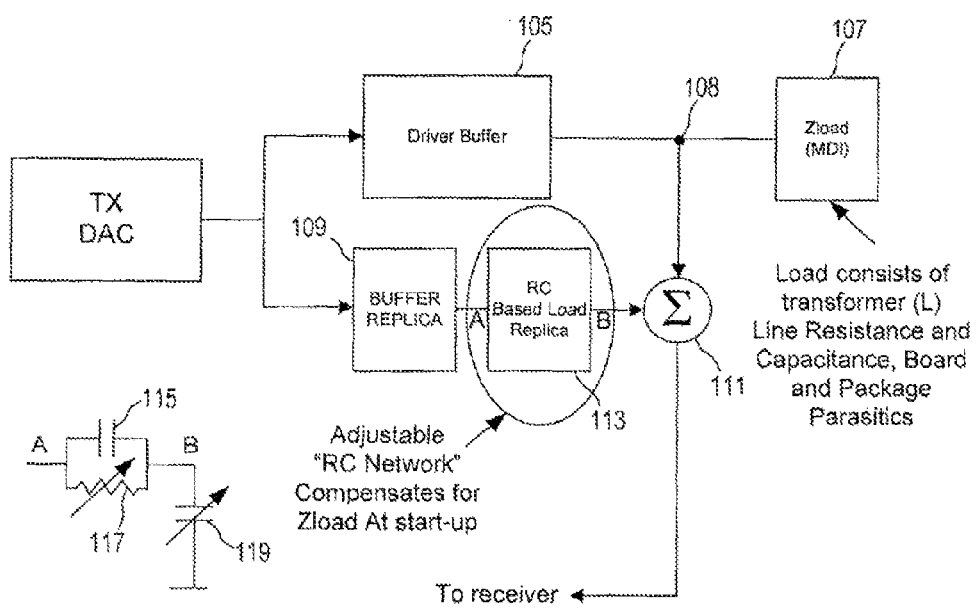
Figure 1. Conceptual diagram of Driver/Hybrid and Frequency Compensation Network

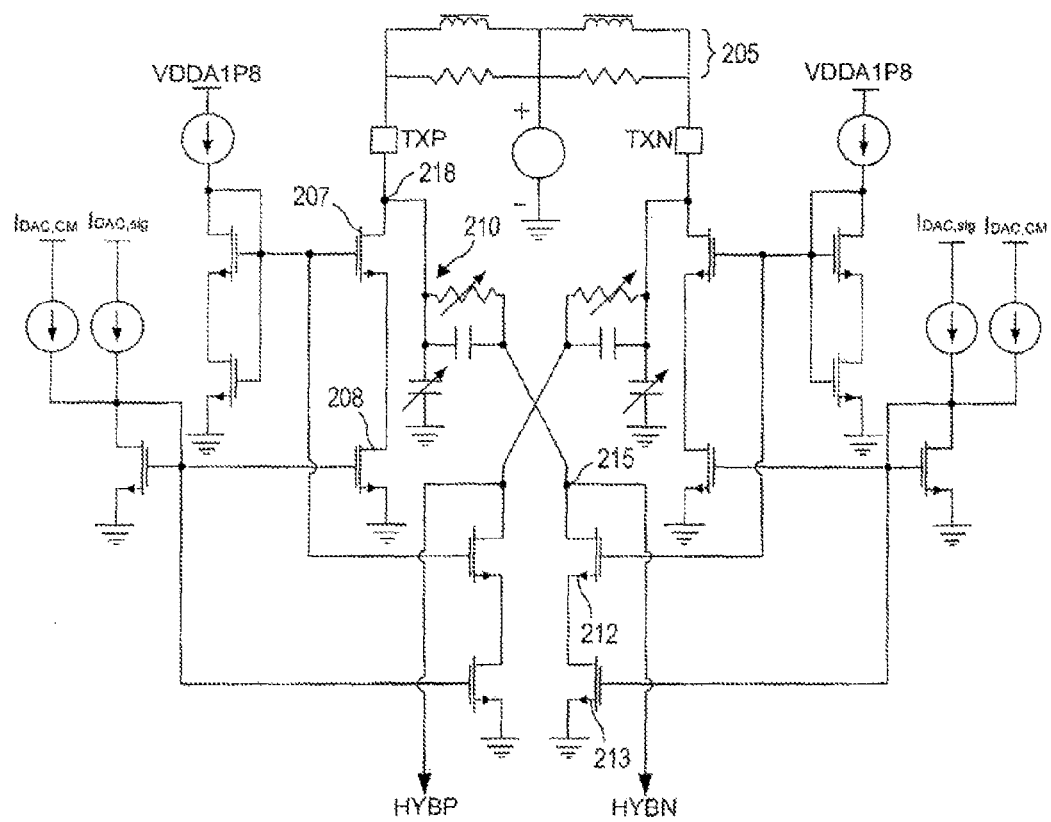
Figure 2. Schematic Representation of the Preferred Embodiment

HYBRID FREQUENCY COMPENSATION NETWORK

CROSS-REFERENCE TO RELATED APPLICATIONS

This application is a divisional of U.S. application Ser. No. 12/284,773, filed Sep. 24, 2008, and issued as U.S. Pat. No. 8,134,386 on Mar. 13, 2012, which application is a continuation of U.S. application Ser. No. 12/012,826 filed Feb. 5, 2008, which application claims priority to U.S. Provisional Patent Application 60/900,180 filed Feb. 7, 2007. These applications and patent are incorporated herein by reference, in their entirety, for any purpose.

FIELD OF THE INVENTION

The present invention relates generally to communication systems. More particularly, the present invention relates to hybrid frequency compensation network.

BACKGROUND

Hybrid circuits are used to subtract the transmit signal from the receive signal in a full duplex communication system. Since the Hybrid circuit and the main line driver are exposed to different loads, accurate subtraction over signal frequency is difficult to achieve. Prior developments have focused on matching edges (rise/fall times) with resistive trimming or lowpass filtering to obtain good subtraction by edge matching or had off chip compensation networks.

SUMMARY

Examples of the invention use a frequency dependent network in the Hybrid that matches, as closely as possible, the loading seen by the driver and the Hybrid. Trimming can make the compensation network more robust. The compensation network can be designed based on active and/or passive components. The trimming of the compensation network can be done during startup calibration or wafer sort. It does not require off-chip components and does not attenuate the signal by lowpass filtering.

BRIEF DESCRIPTION OF THE FIGURES

FIG. 1 is a schematic illustration of a driver, hybrid, and frequency compensation network in accordance with an embodiment of the present invention.

FIG. 2 is a schematic illustration of an embodiment of the present invention.

DETAILED DESCRIPTION

FIG. 1 shows the Driver, Hybrid, and Frequency Compensation Network (FCN). The Driver consists of a buffer 105 that is capable of driving Zload 107. The transmitted signal is accordingly provided at a node 108. Note that the node 108 may also receive a receive signal from the load 107. A replica buffer 109 provides a replica of the transmitted signal at node 'B' so that a summer 111 may subtract the transmitted signal from the received signal, both of which may be present at the node 108. The receive signal may then be sent to the receiver, as shown. The receive data shares the same pins as the transmit buffer schematically shown as node 108. The replica buffer 109 and Frequency Compensation Network 113 act to provide accurate subtraction of the transmitted data. The accuracy of the subtraction depends on how well the main Driver and Replica circuits match as well as how well the loading of the Driver and the replica match. An example implementation of the frequency compensation network 113 is shown in FIG. 1 using capacitor 115, adjustable resistor 117, and adjustable capacitor 119.

The Driver 105 will experience loading due to resistances, capacitances and Inductances. The frequency compensation network 113 accordingly must provide an equivalent load to the Hybrid if the transmit signal is to be subtracted from the received signal accurately across the useable signal bandwidth. A combination of active and/or passive devices can be utilized to minimize the error. The error refers to that portion of the transmit signal that is not effectively removed from the received data. Effectively, the FCN shapes the Hybrid response to equal the transmit response.

FIG. 2 is a schematic illustration of an embodiment of the present invention. An implementation of the load 107 of FIG. 1 is shown schematically as inductors and resistors 205. A differential implementation of the driver 105 of FIG. 1 is shown schematically in FIG. 2 as including transistors 207 and 208 as one end of the differential circuit. The nodes TXP and TXN of FIG. 2 may correspond to the node 108 of FIG. 1. An adjustable RC network 210 is also shown in FIG. 2, which may be used to implement all or a portion of the frequency compensation network 113 of FIG. 1. A buffer replica shown in FIG. 2 may include the transistors 212 and 213, which may be half of a differential implementation of the buffer replica 109 of FIG. 1.

Accordingly, a transmit and receive signal may be present at node 218. A compensated version of these signals may be provided through the network 210 to the node 215. The transistors 212 and 213 may provide a complementary version of the transmit signal, as they pertain to the opposite end of the differential circuit. Accordingly, the signal at node 215 may be substantially equal to the receive signal.

As one of ordinary skill in the art will appreciate, various changes, substitutions, and alterations could be made or otherwise implemented without departing from the principles of the present invention. Accordingly, the examples and drawings disclosed herein including the appendix are for purposes of illustrating the preferred embodiments of the present invention and are not to be construed as limiting the invention.

What is claimed is:

1. A method for separating a receive signal from a hybrid signal, the method comprising:
    receiving the hybrid signal, wherein the hybrid signal includes the receive signal received through a load and a transmit signal received for transmission through the load, and wherein the transmit signal is based, at least in part, on an input signal provided to a driver circuit;
    generating, with a frequency compensation network, an approximation of the transmit signal, wherein said generating includes adjusting a frequency content of the approximation based, at least in part, on an impedance of the load, and providing the input signal to a replica driver circuit; and
    subtracting the approximation of the transmit signal from the hybrid signal, at least in part, to yield the receive signal.

2. The method of claim 1, wherein said adjusting is implemented on a same integrated circuit chip as said subtracting.

3. The method of claim 1, wherein said adjusting comprises selecting a value for a variable impedance element of a load replica.

4. The method of claim 3, wherein the value is selected to equal an impedance of the load.

5. The method of claim 4, wherein the variable impedance element comprises a capacitor or a resistor.

6. The method of claim 1, wherein said adjusting occurs during a wafer sort process.

7. The method of claim 1, wherein said adjusting occurs during a calibration process, and wherein the receive signal is known.

8. The method of claim 1, wherein the transmit signal is generated, at least in part, by a driver circuit, and wherein said generating comprises replicating an operation of the driver circuit.

9. The method of claim 1, wherein the input signal is differential and comprises a first input signal and a second input signal, wherein the driver circuit comprises a first driver and a second driver, and wherein the first driver is configured to receive the first input signal and the second driver is configured to receive the second input signal.

10. The method of claim 9, wherein the replica driver circuit comprises a first replica circuit configured to receive the first input signal and a second replica circuit configured to receive the second input signal.

11. A method, comprising:
receiving a hybrid signal comprising a transmit signal and a receive signal, wherein the transmit signal is based, at least in part, on an input signal provided to a driver circuit;
adjusting, with a frequency compensation network, the transmit signal based, at least in part, on a loading of a driver to provide a replica signal, wherein said adjusting includes providing the input signal to a replica driver circuit; and
subtracting the replica signal from the hybrid signal to provide the receive signal.

12. The method of claim 11, wherein said adjusting occurs during a wafer sort process.

13. The method of claim 11, wherein said adjusting occurs during a startup calibration.

14. The method of claim 11, wherein the replica driver is coupled to a replica load having a loading based, at least in part, on the loading of the driver.

15. The method of claim 14, wherein the replica load comprises an active device.

16. The method of claim 14, wherein the replica load comprises a passive device.

17. The method of claim 11, wherein the hybrid signal is a differential signal comprising a first input signal and a second input signal.

18. The method of claim 17, wherein the driver is configured to buffer the differential input signal, wherein the driver comprises a first driver and a second driver, wherein the first driver is configured to receive the first input signal and the second driver is configured to receive the second input signal, and wherein at least one of the first or second driver comprises a transistor further configured to receive at least one of the first or second input signals at a gate terminal.

19. The method of claim 11, wherein said subtracting comprises providing the hybrid signal and the replica signal to a combiner.

* * * * *